(12) United States Patent  
Suzuki et al.

(10) Patent No.: US 10,273,571 B2  
(45) Date of Patent: Apr. 30, 2019

(54) FILM FORMING SYSTEM

(71) Applicant: TOKYO ELECTRON LIMITED, Tokyo (JP)

(72) Inventors: Yasunobu Suzuki, Nirasaki (JP); Toshiharu Hirata, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 20 days.

(21) Appl. No.: 15/367,813

(22) Filed: Dec. 2, 2016

(65) Prior Publication Data

US 2017/0159170 A1    Jun. 8, 2017

(30) Foreign Application Priority Data

Dec. 4, 2015 (JP) ................. 2015-237518

(51) Int. Cl.
| | |
|---|---|
| *C23C 14/54* | (2006.01) |
| *C23C 14/04* | (2006.01) |
| *C23C 14/34* | (2006.01) |
| *C23C 14/50* | (2006.01) |
| *H01J 37/34* | (2006.01) |

(52) U.S. Cl.
CPC ............ *C23C 14/54* (2013.01); *C23C 14/042* (2013.01); *C23C 14/34* (2013.01); *C23C 14/505* (2013.01); *H01J 37/3411* (2013.01); *H01J 37/3464* (2013.01); *H01J 37/3476* (2013.01)

(58) Field of Classification Search
CPC ....... C23C 14/54; C23C 14/042; C23C 14/34; C23C 14/505; H01J 37/3411; H01J 37/3464; H01J 37/3476

USPC ................. 204/298.25; 156/345.23; 414/217
See application file for complete search history.

(56) References Cited

U.S. PATENT DOCUMENTS

2004/0227085 A1\* 11/2004 Akiyama .............. C23C 14/547  
                                                                            250/339.05  
2008/0295962 A1\* 12/2008 Endo ..................... C23C 16/042  
                                                                            156/345.23  
2010/0080444 A1   4/2010 Yamaguchi et al.  
2011/0038692 A1\*  2/2011 Hofmeister ....... H01L 21/67196  
                                                                            414/217

FOREIGN PATENT DOCUMENTS

JP    2008-306162    12/2008

\* cited by examiner

*Primary Examiner* — Michael A Band

(57) ABSTRACT

A film forming system includes a camera having a field of view in a region through which an edge of a film-formed workpiece rotated by a rotational stage and an edge of the film of the film-formed workpiece pass. Based on three or more images obtained by the camera during the rotation of the film-formed workpiece, widths between the edge of the film-formed workpiece and the edge of the film of the film-formed workpiece at circumferentially different locations are obtained. Based on the widths obtained by the first unit, a first positional deviation of a central position of the film of the film-formed workpiece with respect to a central position of the film-formed workpiece is obtained. By using the first positional deviation of the film-formed workpiece, a transfer position of a transfer modules transferring the workpiece to a film forming apparatus used for producing the film-formed workpiece is corrected.

5 Claims, 14 Drawing Sheets

FILM FORMING SYSTEM

CROSS-REFERENCE TO RELATED APPLICATIONS

This application claims priority to Japanese Patent Application No. 2015-237518 filed on Dec. 4, 2015, the entire contents of which is incorporated herein by reference.

FIELD OF THE INVENTION

The disclosure relates to a film forming system.

BACKGROUND OF THE INVENTION

In manufacturing electronic devices, various processes are performed on a workpiece, e.g., a wafer. As for the processes performed on the workpiece, film formation is known. A film forming system is used for film formation. The film forming system generally includes a film forming apparatus and a transfer module. The film forming apparatus is, e.g., a sputtering apparatus. The transfer module is configured to transfer a workpiece to the film forming apparatus.

The transfer module of the film forming system needs to transfer the workpiece such that a central position of the workpiece coincides with a predetermined position in the film forming apparatus. Therefore, the film forming system further includes a sensor such as a camera. A deviation from the central position of the workpiece detected by the sensor is obtained and a workpiece transfer position of the transfer module is corrected based on the positional deviation. A technique for correcting the workpiece transfer position is disclosed in Japanese Patent Application Publication No. 2008-306162.

The film forming apparatus may need to form a film only on a circular region inward of the circular edge of the workpiece among the entire surface of the workpiece. Therefore, the film forming apparatus is configured to arrange a mask with a circular opening corresponding to the circular region inward of the circular edge of the workpiece during the film formation on the workpiece.

However, if a central position of the workpiece is deviated from a central position of the opening of the mask, a central position of the film is deviated from the central position of the workpiece. Accordingly, a material forming the film may be attached to, e.g., a backside of the workpiece. In addition, when a multilayer film is formed on the workpiece by forming a film on the workpiece in each of a plurality of film forming apparatuses, individual films of the multilayer film may have different central positions.

Therefore, the difference between the central position of the film formed on the workpiece and the central position of the workpiece needs to be reduced or removed.

SUMMARY OF THE INVENTION

In accordance with an aspect, there is provided a film forming system including one or more film forming apparatuses, one or more transfer modules, an image pickup mechanism, a first unit, a second unit and a third unit.

Each of the film forming apparatuses is configured to produce a film-formed workpiece by forming a film on a region inward of a circular edge of a workpiece in a state where a mask having a circular opening is provided on the corresponding region. Each of the transfer modules is configured to transfer the workpiece to the corresponding film forming apparatus. The image pickup mechanism is provided at an outside of the film forming apparatuses, and includes a rotational stage configured to rotatably support a circular object about a center thereof and a camera having a field of view in a region through which an edge of the film-formed workpiece rotated by the rotational stage and an edge of the film of the film-formed workpiece pass. The first unit is configured to obtain, based on three or more images obtained by the camera during the rotation of the film-formed workpiece by the rotational stage, a plurality of widths between the edge of the film-formed workpiece and the edge of the film of the film-formed workpiece at circumferentially different locations. The second unit is configured to obtain, based on the widths obtained by the first unit, a first positional deviation that is a deviation of a central position of the film of the film-formed workpiece with respect to a central position of the film-formed workpiece. The third unit is configured to correct, by using the first positional deviation of the film-formed workpiece produced by each of the film forming apparatuses, a transfer position of any of the transfer modules which transfers the workpiece to any of the film forming apparatuses which has been used for producing the film-formed workpiece.

In the film forming system, a plurality of widths between the edge of the film-formed workpiece and the edge of the film of the film-formed workpiece is obtained at circumferentially different locations of the film-formed workpiece. In other words, the circumferential distribution of the widths between the edge of the film-formed workpiece and the edge of the film of the film-formed workpiece is obtained. The biased distribution reflects the difference between the central position of the film and the central position of the film-formed workpiece. Therefore, the deviation of the central position of the film with respect to the central position of the film-formed workpiece, i.e., the first positional deviation, can be obtained based on the widths. In the film forming system, by using the deviation of the central position of the film of the film-formed workpiece produced by each of the film forming apparatuses, a transfer position of any of the transfer modules which transfers the workpiece to any of the film forming apparatuses which has been used for producing the film-formed workpiece is corrected such that the central position of the workpiece coincides with the central position of the film. Accordingly, it is possible to reduce or eliminate the difference between the central position of the film formed on the workpiece and the central position of the workpiece.

In one embodiment, a plurality of film forming apparatuses and a plurality of transfer modules are provided. The plurality of film forming apparatuses includes a film forming apparatus to which two transfer modules among the plurality of transfer modules are accessible. The workpiece is transferred to the film forming apparatus to which two transfer modules are accessible from only one of the two transfer modules in order to obtain the first positional deviation from the film-formed workpiece produced by the film forming apparatus to which two transfer modules are accessible. The third unit corrects, by using the first positional deviation obtained from the film-formed workpiece produced by the film forming apparatus to which two transfer modules are accessible using the workpiece transferred the one of the two transfer modules, the transfer position of the workpiece that is transferred by the one of the two transfer modules to the film forming apparatus to which two transfer modules are accessible.

In one embodiment, the film forming system further includes a fourth unit. The fourth unit is configured to obtain a second positional deviation that is a deviation of a central position of a workpiece being transferred to the film forming apparatus to which two transfer modules are accessible by the other of the two transfer modules with respect to a reference position at which the central position of the workpiece should be located during the transfer. The third unit corrects, by using the second positional deviation obtained by the fourth unit and the first positional deviation obtained from the film-formed workpiece produced by the film forming apparatus to which two transfer modules are accessible using the workpiece transferred by said one of the two transfer modules, the transfer position of the workpiece that is transferred by the other of the two transfer modules to the film forming apparatus to which two transfer modules are accessible.

In such an embodiment, the first positional deviation is obtained by using the film-formed workpiece produced from the workpiece transferred by one of the two transfer modules. The first positional deviation thus obtained is also used for correcting the transfer position of the other transfer module. Therefore, time required to obtain the first positional deviation can be reduced compared to when the first positional deviation is obtained by transferring the workpiece from each of the two transfer modules to the corresponding process module.

As described above, it is possible to reduce or eliminate the deviation between the center of the film formed on the workpiece and the center of the workpiece.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
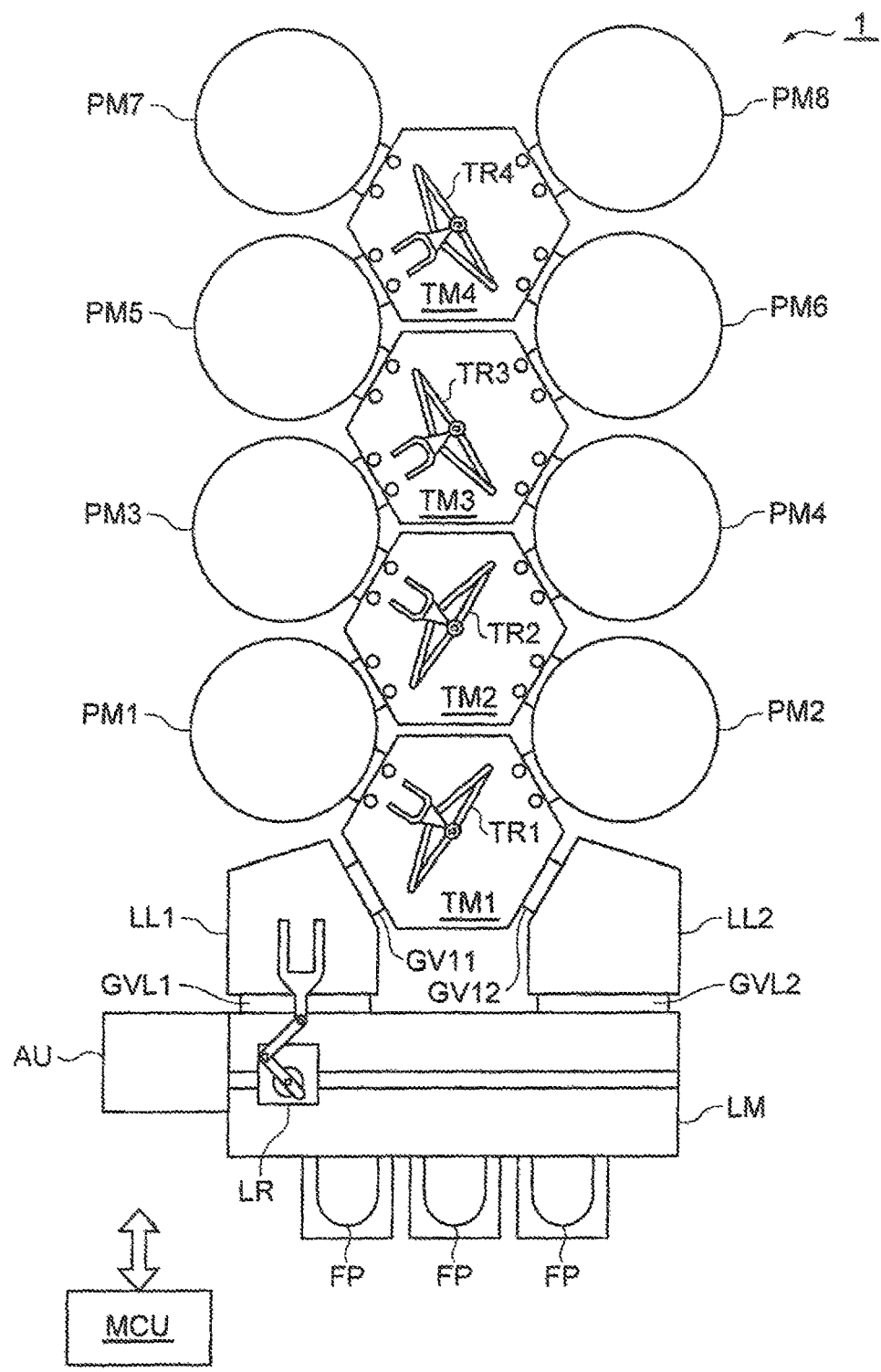
FIG. 1 schematically shows a film forming system according to an embodiment.

Hereinafter, various embodiments will be described in detail with reference to the accompanying drawings. Like reference numerals will be used for like or corresponding parts throughout the drawings.

Figure 2:
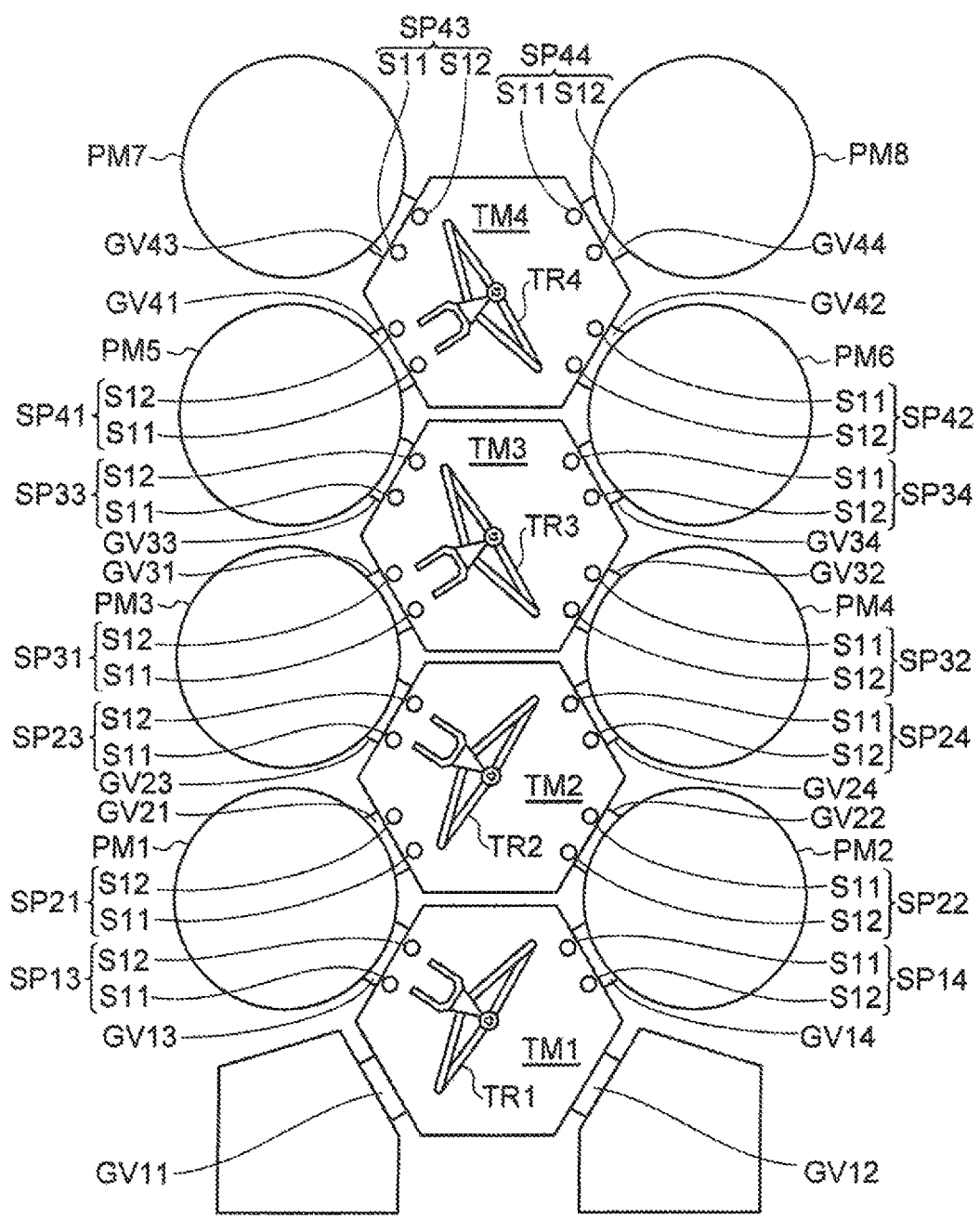
FIG. 2 shows a transfer module and a process module of the film forming system shown in FIG. 1.

FIG. 1 schematically shows a film forming system according to an embodiment. FIG. 2 shows a transfer module and a process module of the film forming system shown in FIG. 1. A film forming system 1 shown in FIGS. 1 and 2 includes process modules PM1 to PM8 and transfer modules TM1 to TM4. The film forming system 1 may further include a loader module LM, an aligner AU, load-lock modules LL1 and LL2, and a control unit MCU.

The loader module LM includes a chamber. An inner space of the chamber of the loader module LM is set to an atmospheric pressure environment. The loader module further includes a transfer unit LR. The transfer unit LR is a transfer robot and may have a multijoint arm, an end effector attached to a leading end of the multijoint arm, and a driving unit for driving the multijoint arm. The multijoint arm and the end effector of the transfer unit LR are provided in the chamber of the loader module LM.

In the film forming system 1, a plurality of FOUPs FP is arranged along one side of the loader module LM. In each of the FOUPs FP, a circular workpiece on which a film is to be formed, e.g., a wafer, and a film-formed workpiece obtained by forming a film on the workpiece are accommodated. In the following description, a term "workpiece" may refer to both of the workpiece on which a film is to be formed and the film-formed workpiece.

The transfer unit LR of the loader module LM transfers a workpiece provided on the end effector. The transfer unit LR of the loader module LM can transfer the work between the FOUP PP and the aligner AU, between the aligner AU and the load-lock module LL1 or LL2, between the load-lock module LL1 or LL2 and the aligner AU, and between the load-lock module LL1 or LL2 and the FOUP FP. The transfer operation of the transfer unit LR of the loader module LM is controlled by a control signal applied from the control unit MCU to the driving unit of the transfer unit LR.

The aligner AU receives the workpiece transferred from the FOUP FP by the transfer unit LR. The aligner AU is used for controlling the transfer position of the workpiece with respect to each of the load-lock modules LL1 and LL2. In other words, the aligner AU is used for pre-alignment. Specifically, the aligner AU is used for detecting a central position of a workpiece and an orientation of a notch of the workpiece with respect to the center of the workpiece and controlling a transfer position of the workpiece such that the notch's orientation and the central position of the workpiece are set to a predetermined orientation and a predetermined position in each of the load-lock modules LL1 and LL2. Further, the aligner AU is used for obtaining an image of an edge portion of the film-formed workpiece. The aligner AU will be described in detail later.

Each of the load-lock modules LL1 and LL2 has a depressurizable chamber and serves as a preliminary decompression chamber. The chamber of the load-lock module LL1 is connected to a chamber of a loader module LM via a gate valve GVL1, and the chamber of the load-lock module LL2 is connected to the chamber of the loader module LM via a gate valve GVL2. The workpiece to be unloaded from the FOUP FP and transferred to any one of the process modules PM1 to PM8 is transferred by the transfer unit LR to the load-lock module LL1 or LL2 and then to the transfer module TM1. The inner space of the chamber of the load-lock module where the workpiece is accommodated is depressurized and, then, the workpiece is transferred to the process module via the transfer module TM1.

The transfer module TM1 has a chamber. An inner space of the chamber of the transfer module TM1 can be depressurized. The chamber of the transfer module TM1 is connected to the chamber of the load-lock module LL1 via a gate valve GV11 and also connected to the chamber of the load-lock module LL2 via a gate valve GV12. Further, the chamber of the transfer module TM1 is connected to a chamber (i.e., a processing chamber) of the process module PM1 via a gate valve GV13 and also connected to a chamber (i.e., a processing chamber) of the process module PM2 via a gate valve GV14. A transfer unit TR1 is provided in the chamber of the transfer module TM1. The transfer unit TR1 is configured to transfer the workpiece between the load-lock module LL1 or LL2 and the process module PM1 or PM2.

A pair of sensors SP13 is provided at a side of the transfer module TM1 which is close to the gate valve GV13. The pair of sensors SP13 is used for correcting the transfer position of the workpiece during transfer to the process module PM1 by the transfer unit TR1. A pair of sensors SP14 is provided at a side of the transfer module TM1 which is close to the gate valve GV14. The pair of sensors SP14 is used for correcting the transfer position of the workpiece during transfer to the process module PM2 by the transfer unit TR1.

The transfer module TM2 has a chamber. An inner space of the chamber of the transfer module TM2 can be depressurized. The chamber of the transfer module TM2 is connected to a chamber (i.e., a processing chamber) of the process module PM1 via a gate valve GV21 and also connected to a chamber (i.e., a processing chamber) of the chamber of the process module PM2 via a gate valve GV22. Further, the chamber of the transfer module TM2 is connected to a chamber (i.e., a processing chamber) of the process module PM3 via a gate valve GV23 and also connected to a chamber (i.e., a processing chamber) of the process module PM4 via a gate valve GV24. A transfer unit TR2 is provided in the chamber of the transfer module TM2. The transfer unit TR2 is configured to transfer a workpiece between any two process modules among the process modules PM1 to PM4.

A pair of sensors SP21 is provided at a side of the transfer module TM2 which is close to the gate valve GV21. The pair of sensors SP21 is used for correcting the transfer position of the workpiece during transfer to the process module PM1 by the transfer unit TR2. A pair of sensors SP22 is provided at a side of the transfer module TM2 which is close to the gate valve GV22. The pair of sensors SP22 is used for correcting the transfer position of the workpiece during transfer to the process module PM2 by the transfer unit TR2. A pair of sensors SP23 is provided at a side of the transfer module TM2 which is close to the gate valve GV23. The pair of sensors SP23 is used for correcting the transfer position of the workpiece during transfer to the process module PM3 by the transfer unit TR2. A pair of sensors SP24 is provided at a side of the transfer module TM2 which is close to the gate valve GV24. The pair of sensors SP24 is used for correcting the transfer position of the workpiece during transfer to the process module PM4 by the transfer unit TR2.

The transfer module TM3 has a chamber. An inner space of the chamber of the transfer module TM3 can be depressurized. The chamber of the transfer module TM3 is connected to a chamber (i.e., a processing chamber) of the process module PM3 via a gate valve GV31 and also connected to a chamber (i.e., a processing chamber) of the process module PM4 via a gate valve GV32. Further, the chamber of the transfer module TM3 is connected to a chamber (i.e., a processing chamber) of the process module PM5 via a gate valve GV33 and also connected to a chamber (i.e., a processing chamber) of the process module PM6 via a gate valve GV34. A transfer unit TR3 is provided in the chamber of the transfer module TM3. The transfer unit TR3 is configured to transfer a workpiece between to any two process modules among the process modules PM3 to PM6.

A pair of sensors SP31 is provided at a side of the transfer module TM3 which is close to the gate valve GV31. The pair of sensors SP31 is used for correcting the transfer position of the workpiece during transfer to the process module PM3 by the transfer unit TR3. A pair of sensors SP32 is provided at a side of the transfer module TM3 which is close to the gate valve GV32. The pair of sensors SP32 is used for correcting the transfer position of the workpiece during transfer to the process module PM4 by the transfer unit TR3. A pair of sensors SP33 is provided at a side of the transfer module TM3 which is close to the gate valve GV33. The pair of sensors SP33 is used for correcting the transfer position of the workpiece during transfer to the process module PM5 by the transfer unit TR3. A pair of sensors SP34 is provided at a side of the transfer module TM3 which is close to the gate valve GV34. The pair of sensors SP34 is used for correcting the transfer position of the workpiece during transfer to the process module PM6 by the transfer unit TR3.

The transfer module TM4 has a chamber. An inner space of the chamber of the transfer module TM4 can be depressurized. The chamber of the transfer module TM4 is connected to a chamber (i.e., a processing chamber) of the process module PM5 via a gate valve GV41 and also connected to a chamber (i.e., a processing chamber) of the process module PM6 via a gate valve GV42. Further, the chamber of the transfer module TM4 is connected to a chamber (i.e., a processing chamber) of the process module PM7 via a gate valve GV43 and also connected to a chamber (i.e., a processing chamber) of the process module PM8 via a gate valve GV44. A transfer unit TR4 is provided in the chamber of the transfer module TM4. The transfer unit TR4 is configured to transfer a workpiece between any two process modules among the process modules PM5 to PM8.

A pair of sensors SP41 is provided at a side of the transfer module TM4 which is close to the gate valve GV41. The pair of sensors SP41 is used for correcting the transfer position of the workpiece during transfer to the process module PM5 by the transfer unit TR4. A pair of sensors SP42 is provided at a side of the transfer module TM4 which is close to the gate valve GV42. The pair of sensors SP42 is used for correcting the transfer position of the workpiece during transfer to the process module PM6 by the transfer unit TR4. A pair of sensors SP43 is provided at a side of the transfer module TM4 which is close to the gate valve GV43. The pair of sensors SP43 is used for correcting the transfer position of the workpiece during transfer to the process module PM7 by the transfer unit TR4. A pair of sensors SP44 is provided at a side of the transfer module TM4 which is close to the gate valve GV44. The pair of sensors SP44 is used for correcting the transfer position of the workpiece during transfer to the process module PM8 by the transfer unit TR4.

Figure 3:
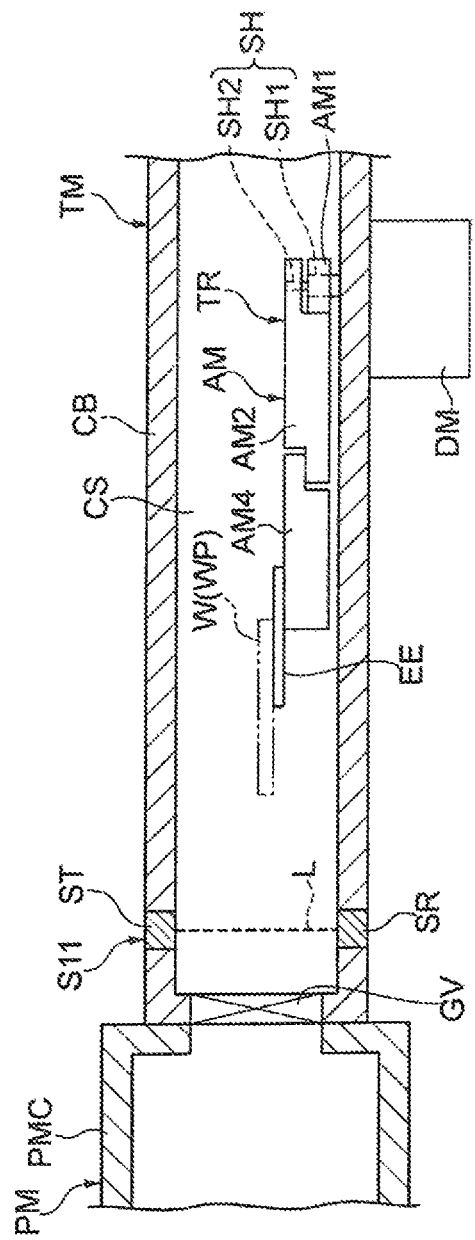
FIG. 3 is a vertical cross sectional view of the transfer module.
Figure 4:
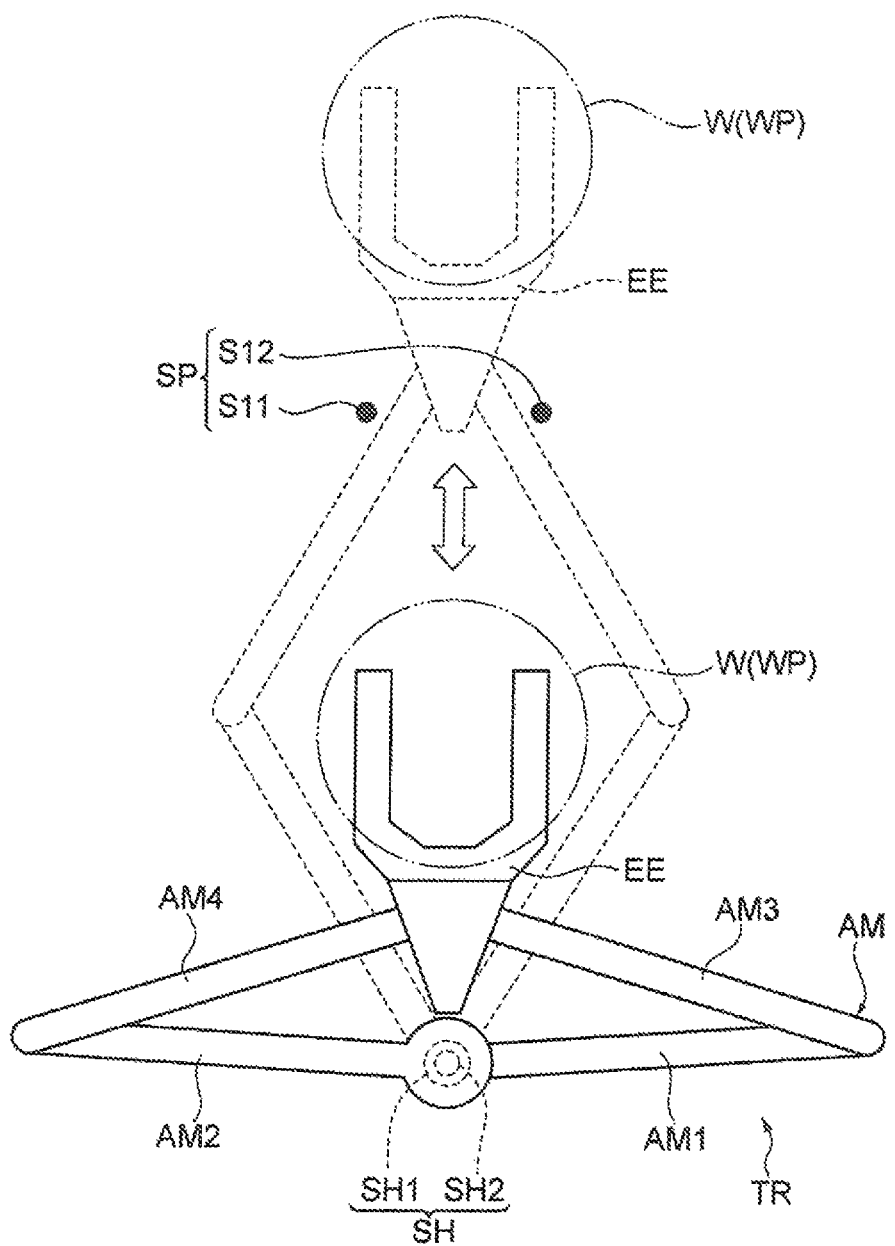
FIGS. 4 and 5 are top views showing an operation of a transfer unit of the transfer module.
Figure 5:
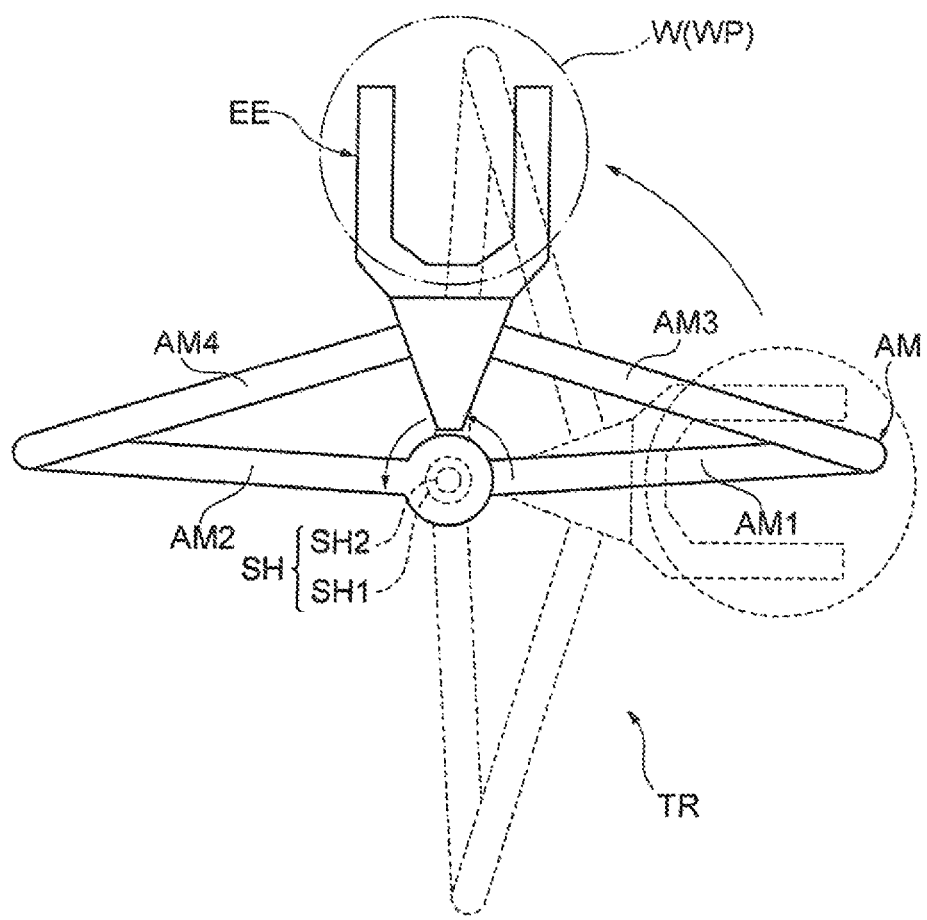

Hereinafter, FIGS. 3 to 5 will be referred to. FIG. 3 is a vertical cross sectional view of the transfer module. FIGS. 4 and 5 are top views showing an operation of the transfer unit of the transfer module. Hereinafter, a single transfer module TM and a process module PM connected to the single transfer module TM will be described with reference to FIGS. 3 to 5. Each of the transfer modules TM1 to TM4 has the same configuration as that of the transfer module TM. Each of the transfer units TR1 to TR4 has the same configuration as that of the transfer unit TR of the transfer module TM. Each of the sensor pairs SP13 and SP14, the sensor pairs SP21 to SP24, the sensor pairs SP31 to SP34 and the sensor pairs SP41 to SP44 has the same configuration as that of the sensor pair SP described with reference to FIGS. 3 to 5.

The transfer module TM includes a chamber CB and a transfer unit TR. The chamber CB provides a depressurizable inner space CS. The transfer unit TR has a driving unit DM, a multijoint arm AM and an end effector EE. The driving unit DM has a shaft SH and is fixed to the chamber CB. The shaft SH has rotation axes SH1 and SH2. The position of the shaft SH is fixed. The rotation axes SH1 and SH2 extend in a vertical direction and are coaxially arranged. The driving unit DM is, e.g., a motor, and rotates the rotation axes SH1 and SH2 individually by the control signal from the control unit MCU.

The multijoint arm AM has arms AM1 to AM4. One end portion of the arm AM1 is supported by the rotation axis SH1. The arm AM1 can pivot about an axis line of the rotation axis SH1. One end portion of the arm AM2 is supported by the rotation axis SH2. The arm AM2 can pivot about an axis line of the rotation axis SH2. One end portion of the arm AM3 is connected to the other end portion of the arm AM1. The arm AM3 can pivot about an axis line extending in a vertical direction in the other end portion of the arm AM1. One end portion of the arm AM4 is connected to the other end portion of the arm AM2. The arm AM4 can pivot about an axis line extending in a vertical direction in the other end portion of the arm AM2. The end effector EE is attached to the other end portion of the arm AM3 and the other end portion of the arm AM4.

As shown in FIG. 4, when the rotation axes SH1 and SH2 are driven by the driving unit DM such that an angle between the arms AM1 and AM2 becomes comparatively greater, the multijoint arm AM is contracted and a distance between the end effector EE and the shaft SH becomes short, as indicated by a solid line in FIG. 4. On the other hand, when the rotation axes SH1 and SH2 are driven by the driving unit DM such that an angle between the arms AM1 and AM2 becomes smaller, the multijoint arm AM is extended and a distance between the end effector EE and the shaft SH is increased, as indicated by a dotted line in FIG. 4. In other words, in the transfer unit TR, the distance from the shaft SH to the end effector EE is variable. As shown in FIG. 5, when the arms AM1 and AM2 are rotated in the same circumferential direction by the driving unit DM, the entire multijoint arm AM is rotated. Accordingly, the position in the rotational direction of the end effector EE about the shaft SH can be changed. The workpiece W supported on the end effector EE can be transferred to a chamber PMC of the process module PM by the operation of the driving unit DM. The operation of the driving unit DM is controlled by the control signal from the control unit MCU.

The sensor pair SP is provided at a region along a transfer route of the workpiece WP to the process module PM by the transfer unit TR. The region is disposed at a side of the transfer module TM which is close to the gate valve GV provided between the process module PM and the chamber CB of the transfer module TM. The sensor pair SP includes sensors S11 and S12. The sensors S11 and S12 are arranged along a horizontal line substantially perpendicular to the transfer route of the workpiece WP transferred to the process module PM by the transfer unit TR.

As shown in FIG. 3, each of the sensors S11 and S12 has a light emitter ST and a light receiver SR. The light emitter ST and the light receiver SR are arranged along the vertical direction. The light emitter ST outputs light L and the light receiver SR outputs a signal having a level in accordance with an intensity of light incident on the light receiver SR. The light L outputted by the light emitter ST enters the light receiver SR when the workpiece WP does not exist between the light emitter ST and the light receiver SR. When the workpiece WP exists between the light emitter ST and the light receiver SR, the light L from the light emitter ST is blocked by the workpiece WP and does not enter the light receiver SR. Therefore, the light receiver SR can output signals having different levels depending on presence or absence of the workpiece WP between the light emitter ST and the light receiver SR. As will be described later, the signal from the light receiver SR is applied to the control unit MCU. The control unit MCU can obtain a positional deviation (second positional deviation) of the central position of the workpiece WP during actual transfer with respect to a reference position at which the central position of the workpiece WP should be located during transfer based on the signal outputted by the light receiver SR of the sensor S11 and the signal outputted from the light receiver SR of the sensor S12. The control unit MCU can correct the corresponding transfer position by feedbacking the second positional deviation to the transfer position of the workpiece of the transfer unit TR, i.e., the transfer position of the workpiece WP in the process module PM.

Referring back to FIG. 1, the process modules PM1 to PM8 process the workpiece WP. In one example, the process module PM6 may be a heat treatment apparatus and the other process modules may be film forming apparatuses. Further, any one of the process modules PM1 to PM8 may be a film forming apparatus and the other process modules may be apparatuses for performing processes other than film formation. Moreover, all of the process modules PM1 to PM8 may be film forming apparatuses.

Figure 6:
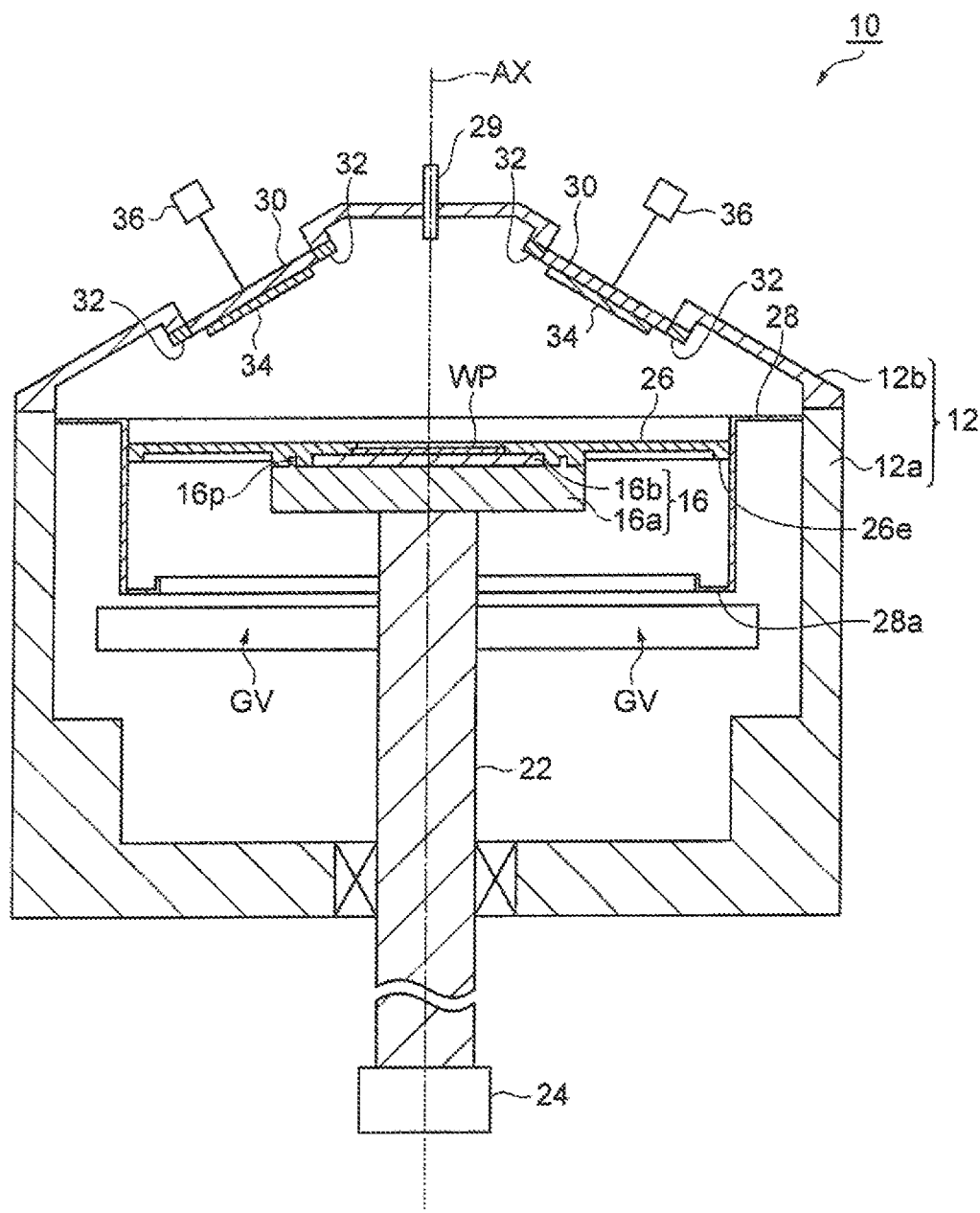
FIG. 6 schematically shows a film forming apparatus.

FIG. 6 schematically shows the film forming apparatus. The film forming apparatus 10 shown in FIG. 6 may be used as the film forming process module among the process modules PM1 to PM8. The film forming apparatus 10 is configured to produce a film-formed workpiece by providing a mask during film formation on the workpiece WP and forming a film on a region of the workpiece WP which is exposed through the mask. Specifically, the film forming apparatus 10 is configured to form a film on a region of the workpiece WP which is located inward of the circular edge of the workpiece WP in a state where the mask that provides a circular opening is provided on the corresponding region.

As shown in FIG. 6, the film forming apparatus 10 includes a processing chamber 12. The processing chamber 12 has a main body 12a and a lid 12b. The main body 12a is formed in a substantially cylindrical shape and has an upper open end. In one embodiment, the main body 12a has a substantially cylindrical shape and a central axis line of the main body 12a coincides with an axis line AX. The lid 12b is provided on the main body 12a. The upper open end of the main body 12a is covered by the lid 12b, a holder 30 and a holder support 32. The holder 30 and the holder support 32 will be described later.

A stage 16 is provided in the processing chamber 12. The stage 16 includes a base portion 16a and an electrostatic chuck 16b. The base portion 16a has a substantially disc shape. The electrostatic chuck 16b is provided on the base portion 16a. The electrostatic chuck 16b has a substantially disc shape and a center thereof is positioned substantially on the axis line AX. The electrostatic chuck 16b generates an electrostatic force by a voltage applied from a power supply provided outside the processing chamber 12 to attract and hold the workpiece WP thereon by the electrostatic force thus generated.

A shaft body 22 is coupled to the base portion 16a. The shaft body 22 extends downward from the base portion 16a. The shaft body 22 extends through a bottom portion of the main body 12a of the processing chamber 12 to the outside of the processing chamber 12. A sealing mechanism for airtightly sealing an inner space of the processing chamber 12 is provided between the shaft body 22 and the bottom portion of the main body 12a of the processing chamber 12. A central axis line of the shaft body 22 substantially coincides with the axis line AX.

The shaft body 22 is connected to a driving unit 24 at the outside of the processing chamber 12. The driving unit 24 rotates the shaft body 22 about the central axis line thereof and moves the shaft body 22 up and down. In the case of mounting the workpiece WP on the stage 16, the driving unit 24 moves the stage 16 to a comparatively low position in the processing chamber 12. The workpiece WP transferred into the processing chamber 12 by the transfer unit TR is attracted and held on the electrostatic chuck 16b. Then, the driving unit 24 moves the stage 16 upward in order to form a film on the workpiece WP. During the upward movement of the stage 16, the mask 26 is provided on the stage 16. The mask 26 is an annular plate and provides an opening having a diameter smaller than a diameter of the workpiece WP. An outer edge 26e of the mask 26 protrudes downward. A plurality of recesses is formed at a bottom surface of the mask 26. A plurality of protrusions 16p is formed at positions of the stage 16 which correspond to the recesses. By fitting the protrusions 16p into the recesses of the mask 26, the mask 26 is fixed to the stage 16. It is also possible to form a plurality of protrusions at the mask 26 and a plurality of recesses at the stage 16 into which the protrusions can be fitted.

A mask support 28 is provided in the processing chamber 12. The mask support 28 is suspended from the processing chamber 12. The mask support 28 opens in a region where the stage 16 is moved (region along the axis line AX) so that the vertical movement of the stage 16 is not disturbed. The mask support 28 has a supporting portion 28a. The supporting portion 28a provides a recess that opens upward and extends in a circumferential direction with respect to the axis line AX. The outer edge 26e of the mask 26 is disposed at the recess provided by the supporting portion 28a. Accordingly, the mask 26 separated from the stage 16 is supported by the mask support 28.

The film forming apparatus 10 further includes a gas supply unit 29. The gas supply unit 29 is configured to supply a gas into an inner space of the processing chamber 12. The film forming apparatus 10 includes the holder 30 and the holder support 32. The holder support 32 is an insulator and attached to the lid 12b. The holder support 32 supports the holder 30 and electrically insulates the holder 30 from the lid 12b. The holder 30 holds a target 34. The power supply 36 is connected to the holder 30. When a voltage is applied from the power supply 36 to the holder 30, an electric field is generated near the target 34. Due to the electric field thus generated, the gas supplied from the gas supply unit 29 is dissociated and ions are generated. The ions collide with the target 34, so that materials are sputtered from the target 34. The sputtered materials are deposited on the workpiece WP.

When the film forming apparatus 10 is used, the stage 16 is first located at a position lower than a position of the stage 16 during the film formation by the driving unit 24. Then, the workpiece WP is mounted on the stage 16 by the transfer unit TR. The workpiece WP is attracted and held on the electrostatic chuck 16b. Next, the stage 16 is raised by the driving unit 24 and the mask 26 is fixed to the stage 16. The stage 16 is further raised by the driving unit 24 and reaches a film forming position. Then, the stage 16 is rotated by the driving unit 24. The gas from the gas supply unit 29 is supplied into the inner space of the processing chamber 12, and the voltage is applied from the power supply 36 to the holder 30. Accordingly, the materials sputtered from the target 34 are deposited on the workpiece WP, which results in a film-formed workpiece. In the operation of the film forming apparatus 10, the respective components of the film forming apparatus 10 are controlled by the control unit MCU.

Figure 7:
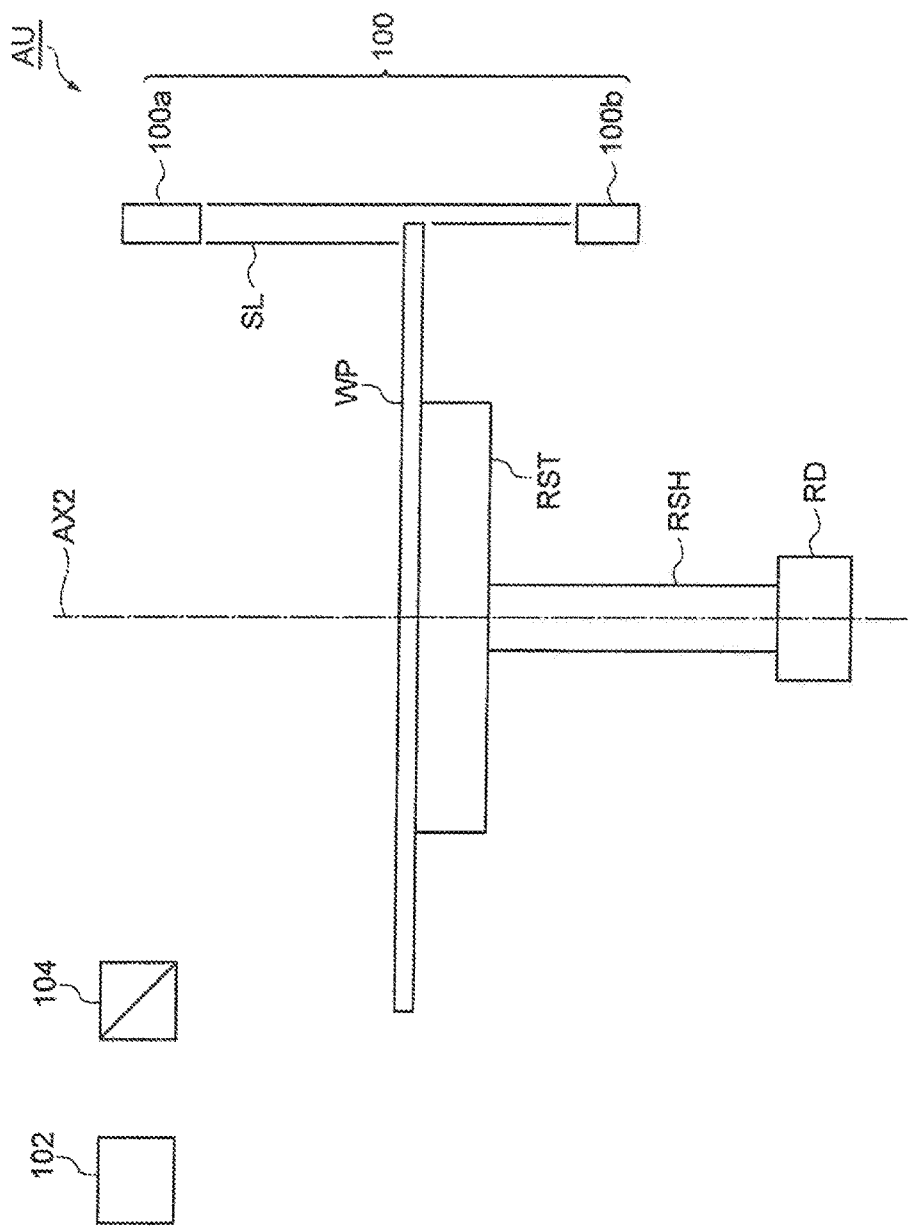
FIGS. 7 to 10 show a configuration of an aligner.
Figure 8:
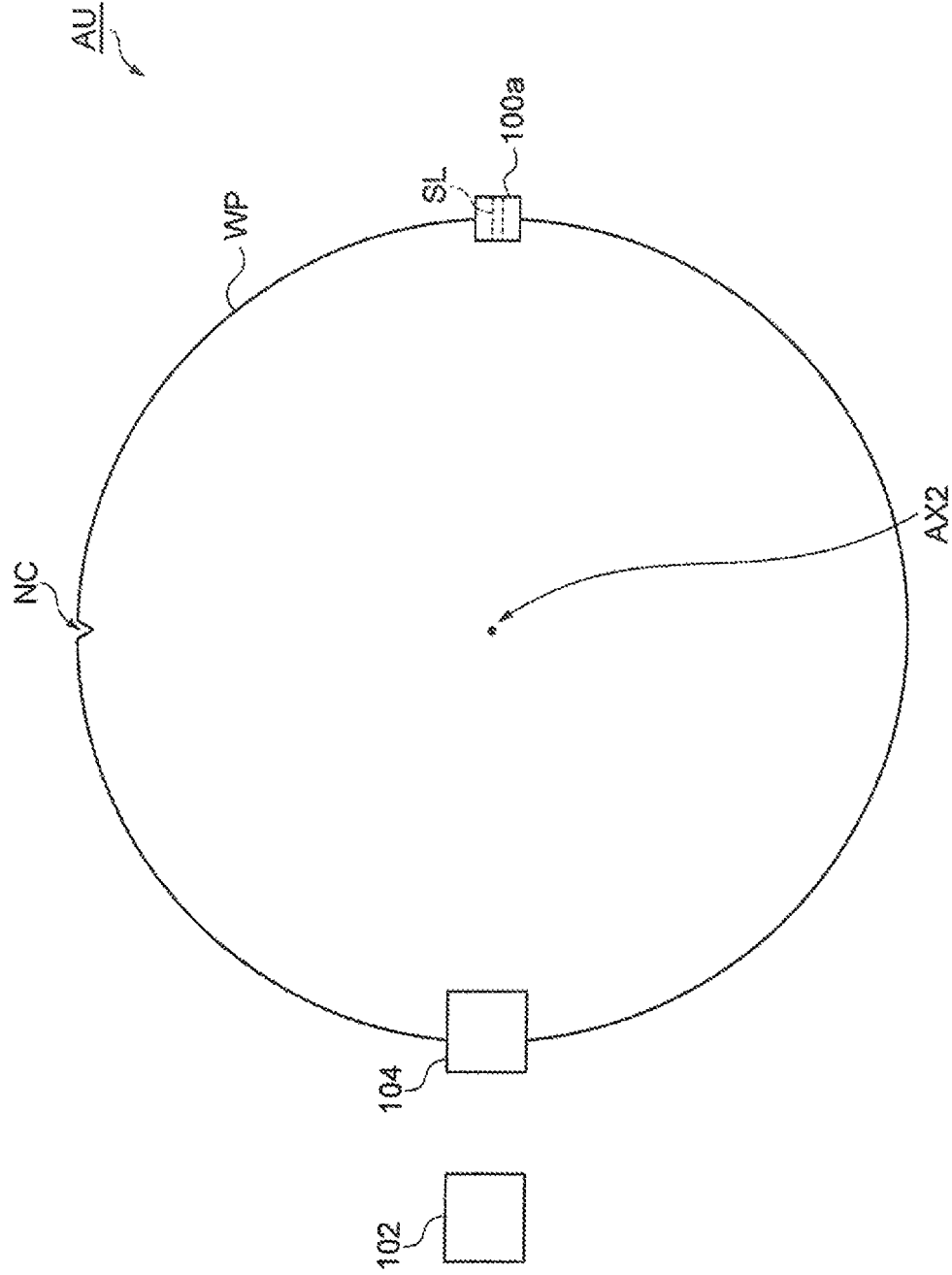
Figure 9:
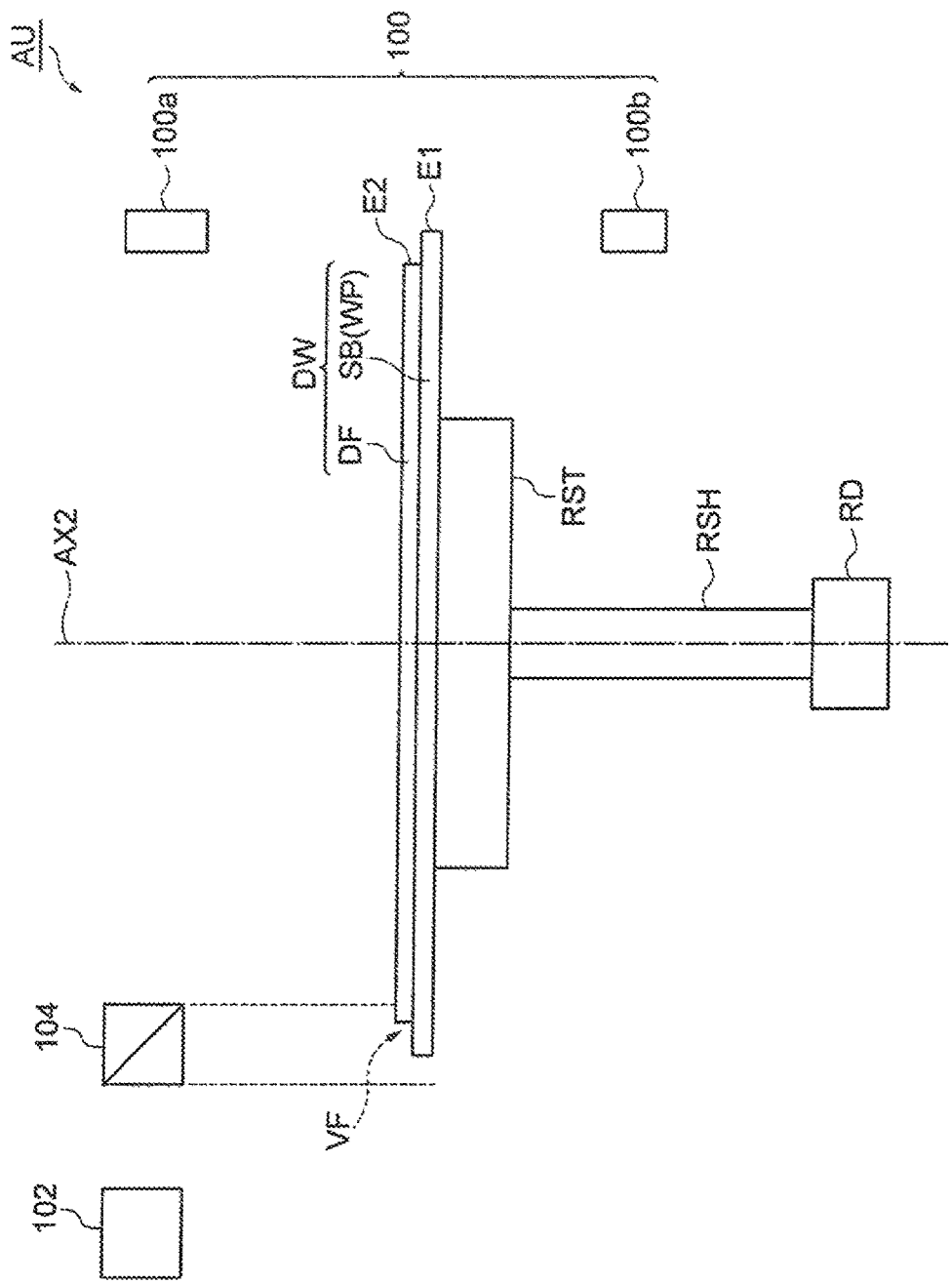
Figure 10:
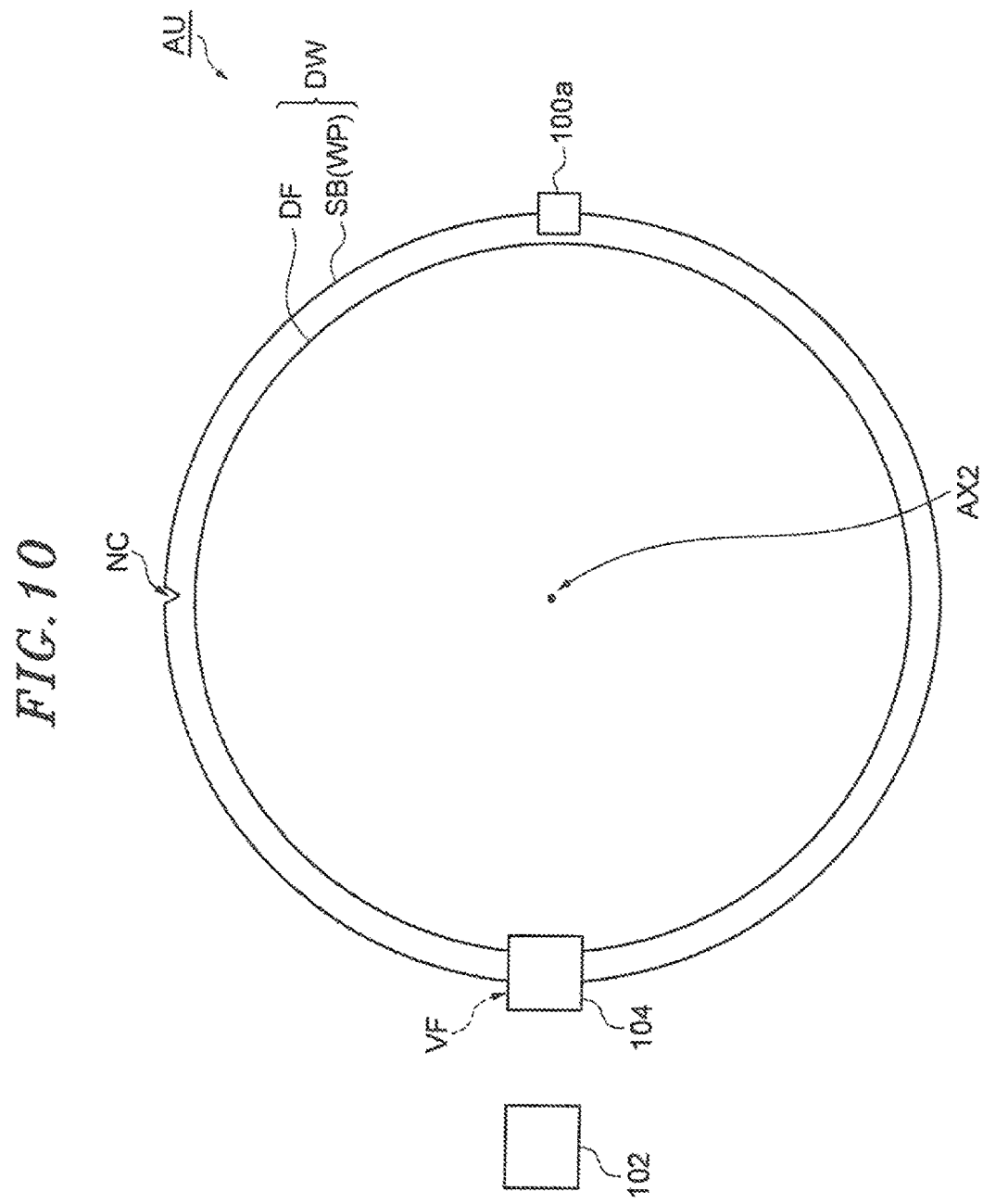

Hereinafter, the aligner AU of the film forming system 1 will be described. FIGS. 7 to 10 show the configuration of the aligner. FIGS. 7 and 9 are side views of the aligner. FIGS. 8 and 10 are top views of the aligner. In FIGS. 7 and 8, the aligner and the workpiece WP are illustrated. In FIGS. 9 and 10, the aligner and the film-formed workpiece DW are illustrated. As described above, the film-formed workpiece DW is produced by the film forming apparatus 10 and has a film DF on a base SB. The workpiece WP serves as the base SB in the film-formed workpiece DW.

As shown in FIGS. 7 to 10, the aligner AU has a rotational stage RST and a sensor 100. The rotational stage RST supports the workpiece WP or the film-formed workpiece DW thereon. A shaft RSH is coupled to the rotational stage RST. The shaft RSH extends downward from the rotational stage RST. The shaft RSH is connected to a driving unit RD. The driving unit RD rotates the shaft RSH about a central axis line AX2 of the shaft RSH. The rotational stage RST is rotated by the rotation of the shaft RSH.

The sensor 100 is used for pre-alignment that is performed before the transfer of the workpiece WP to the load-lock modules LL1 and LL2. The sensor 100 has a light emitter 100a and a light receiver 100b. As shown in FIGS. 7 and 8, the light emitter 100a and the light receiver 100b are arranged in the vertical direction so that the workpiece WP can pass therebetween. The light emitter 100a emits light SL to a line-shaped region. The line-shaped region extends in a diametrical direction with respect to the central axis line AX2 and corresponds to a region substantially perpendicular to the edge of the workpiece WP. A part of the light outputted from the light emitter 100a is blocked by the workpiece WP and the other part of the light SL is received by the light receiver 100b. The light receiver 100b outputs a signal having a level determined by the amount of the received light. During the pre-alignment, the workpiece WP mounted on the rotational stage RST is rotated. When the center of the workpiece WP is positioned on the central axis line AX2, the level of the signal outputted from the light receive 10b is substantially not changed except when the notch NC of the workpiece WP is located in the line-shaped region. When the center of the workpiece WP is not positioned on the central axis line AX2, the amount of light incident on the light receiver 100b is changed. Therefore, the orientation of the notch NC with respect to the central axis line AX2 and the deviation of the central position of the workpiece WP with respect to the central axis line AX2 can be obtained by analyzing the signal outputted from the light receiver 100b.

The aligner AU is provided with a camera 102. As shown in FIGS. 9 and 10, the camera 102 has a field of view VF in a region through which the edges of the film-formed workpiece DW rotated by the rotational stage RST, i.e., an edge E1 of the base SB and an edge E2 of the film DF, pass. The film-formed workpiece DW is held on the rotational stage RST such that the center thereof coincides with the central axis line AX2.

In one embodiment, a reflection mirror 104 is provided above the region through which the edges E1 and E2 pass. The reflection mirror 104 changes an advancing direction of the light from the bottom in a radial direction with respect to the central axis line AX2. The camera 102 and the reflection mirror 104 are arranged along the radial direction with respect to the central axis line AX2. The distance between the camera 102 and the central axis line AX2 is greater than the distance from the reflection mirror 104 and the central axis line AX2. Further, the camera 102 is optically coupled to the reflection mirror 104. Accordingly, an image of the field of view VF is obtained by the camera 102. The camera 102 and the rotational stage RST constitute an image pickup mechanism of one embodiment.

The camera 102 obtains a plurality of images during the rotation of the film-formed workpiece DW by the rotational stage RST. Three or more images are obtained by the camera 102 during the rotation of the film-formed workpiece DW. The camera 102 can obtain the images at substantially regular time intervals during the rotation of the film-formed workpiece DW by 360°. As will be described later, the timings of obtaining a plurality of images by the camera 102 during the rotation of the film-formed workpiece DW may arbitrarily be set as long as the positional deviation (first positional deviation) between the center of the film-formed workpiece DW, i.e., the center of the base SB, and the center of the film DF is obtained from the plurality of images obtained by the camera 102.

Figure 11:
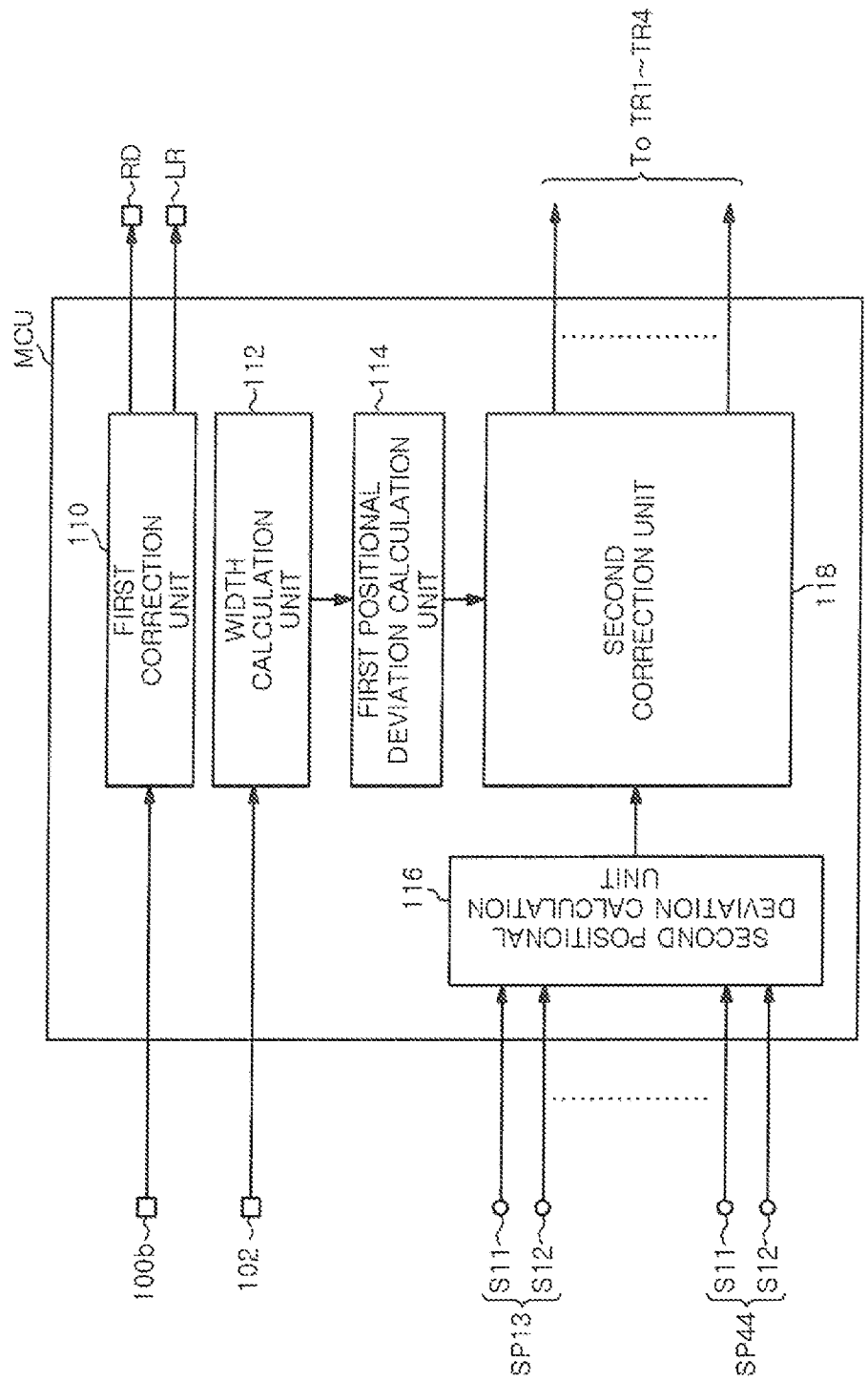
FIG. 11 shows a configuration of a control unit MCU.

Hereinafter, the control unit MCU will be described. FIG. 11 shows the configuration of the control unit MCU. The control unit MCU includes a first correction unit 110, a width calculation unit 112, a first positional deviation calculation unit 114, a second positional deviation calculation unit 116, and a second correction unit 118.

The first correction unit 110 receives a signal from the light receiver 100b of the aligner AU. The first correction unit 110 obtains the orientation of the notch NC of the workpiece WP held on the rotational stage RST with respect to the central axis line AX2 and the deviation of the central position of the workpiece WP with respect to the central axis line AX2 by using the signal from the light receiver 100b of the aligner AU. The first correction unit 110 controls the driving unit RD such that the notch NC is directed in a predetermined orientation based on the obtained orientation of the notch NC. The first correction unit 110 controls the transfer unit LR of the loader module LM based on the deviation of the central position of the workpiece WP. Specifically, the first correction unit 110 controls the transfer unit LR such that the center of the workpiece WP is located at a predetermined position on the end effector of the transfer unit LR of the loader module LM. When the workpiece WP is transferred by the transfer unit LR, the central position of the workpiece WP and the orientation of the notch NC are set to the predetermined position and the predetermined orientation in each of the load-lock modules LL1 and LL2.

The width calculation unit 112 receives a plurality of images obtained by the camera 102 from the camera 102. The images are obtained by the camera 102 during the rotation of the film-formed workpiece DW by the rotational stage RST. The width calculation unit 112 calculates, based on the images obtained by the camera 102, a plurality of widths between the edge E1 of the film-formed workpiece DW and the edge E2 of the film DF in a plurality of locations whose circumferential directions are different.

Figure 12:
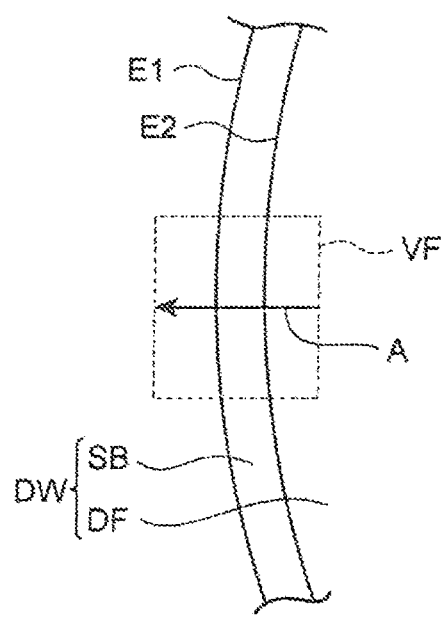
FIG. 12 is an enlarged view of a region including an edge of a film-formed workpiece.
Figure 13:
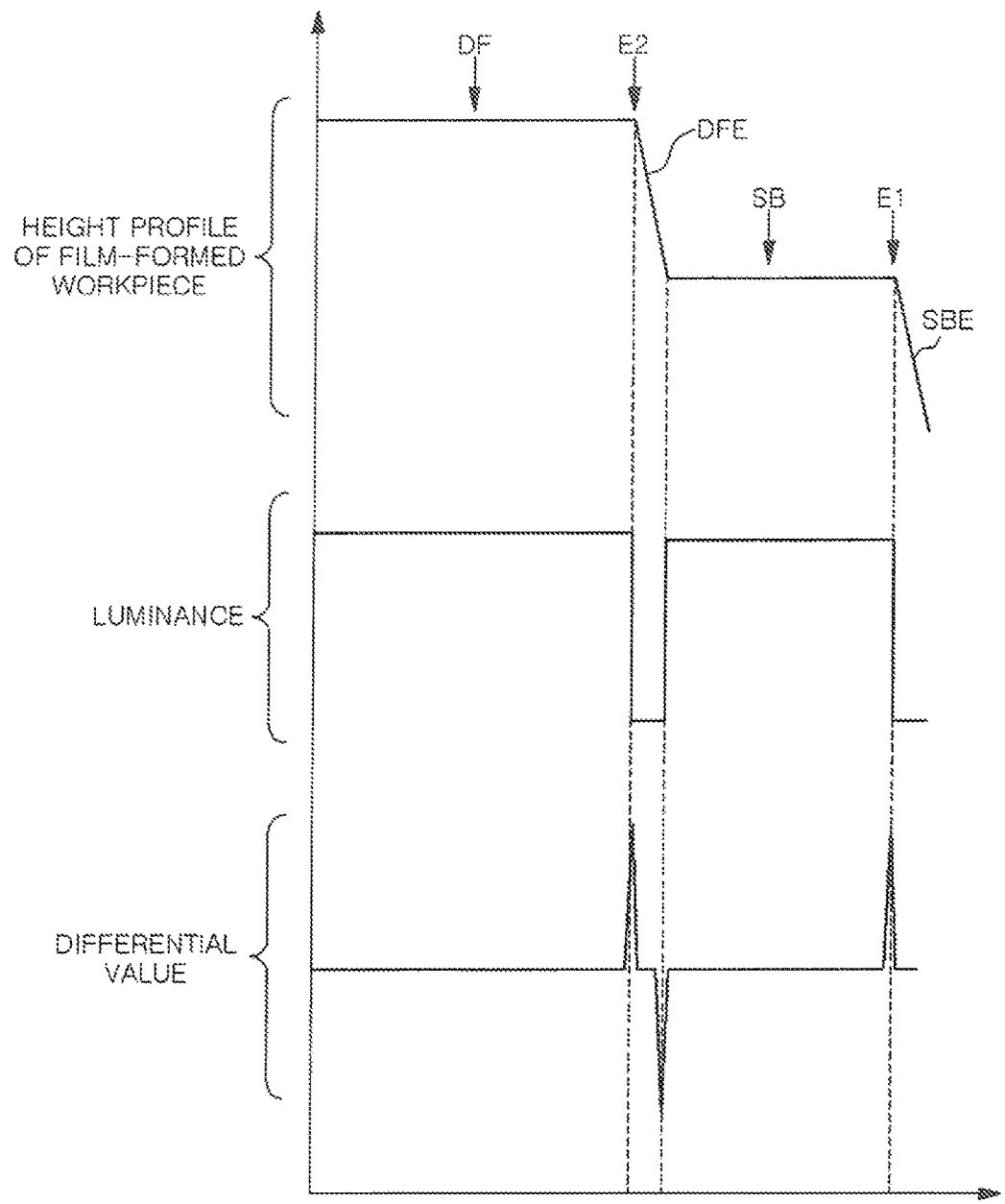
FIG. 13 shows a height profile in a region indicated by an arrow A shown in FIG. 12 on a surface of the film-formed workpiece, a luminance of a pixel array of an image obtained by a camera 102, and a differential value of the luminance of the pixel array.

Hereinafter, FIGS. 12 and 13 will be referred to. FIG. 12 is an enlarged view of a region including the edge of the film-formed workpiece. FIG. 13 shows a height profile in a region indicated by an arrow A shown in FIG. 12 on the surface of the film-formed workpiece, a luminance of a pixel array of an image obtained by the camera 102, and a differential value of the luminance of the corresponding pixel array. The arrow A extends in a radial direction from the side of the center of the film-formed workpiece DW within the field of view VF of the camera 102. As can be seen from the height profile shown in FIG. 13, the surface of the film-formed workpiece DW includes a substantially flat surface of the film DF inward of the end surface DFE of the film DF and a substantially flat top surface of the base SB between the end surface DFE of the film DF and the end surface SBE of the base SB. Therefore, a height of the surface of the film-formed workpiece DW inward of the end surface DFE of the film DF is uniform. A height of the surface of the film-formed workpiece DW in the end surface DFE of the film DF is abruptly decreased. A height of the surface of the film-formed workpiece DW between the end surface DFE of the film DF and the end surface SBE of the base SB is uniform and lower than the height of the surface of the film-formed workpiece inward of the end surface DFE of the film DF. A height of the surface of the film-formed workpiece DW in the end surface SBE of the base SB is abruptly decreased.

As shown in FIG. 13, in the image of the field of view VF of the film-formed workpiece DW having the above height profile, pixels corresponding to the surface of the film-formed workpiece DW inward of the end surface DFE of the film DF have a high luminance. Pixels corresponding to the surface of the film-formed workpiece DW between the end surface DFE of the film DF and the end surface SBE of the base SB have a comparatively high luminance. Pixels corresponding to the end surface DFE of the film DF have a low luminance. Pixels corresponding to the end surface SBE of the base SB have a low luminance. Therefore, as can be seen from FIG. 13, a differential value of the luminance of the pixel array corresponding to the arrow A has peaks at locations corresponding to the edge E2 of the film DF and the edge E1 of the base SB (edge of the film-formed workpiece DW).

The width calculation unit 112 refers to the pixel values of the pixel array corresponding to the arrow A in each of the images obtained by the camera 102, specifies positions of two pixels of which luminances change abruptly from high to low, and calculates a width between the two pixels. In this way, the width calculation unit 112 can calculate a plurality of widths between the edge E1 of the film-formed workpiece DW and the edge E2 of the film DF. Alternatively, the width calculation unit 112 refers to the differential value of the pixels of the pixel array corresponding to the arrow A in each of the images obtained by the camera 102, specifies two pixels having peak differential values, and calculates a width between the two pixels. In this way, the width calculation unit 112 can calculates a plurality of width between the edge E1 of the film-formed workpiece DW and the edge E2 of the film DF.

The first positional deviation calculation unit 114 calculates a deviation of the central position of the film DF with respect to the central position of the film-formed workpiece DW, i.e., the first positional deviation, from the widths calculated by the width calculation unit 112. For example, the first positional deviation calculation unit 114 can calculate, as the first positional deviation, a deviation between a central position of one of two circles having the plurality of widths therebetween and a central position of the other circle. The first positional deviation is a vector quantity in a coordinate system having, as a reference, the orientation of the notch NC with respect to the center of the film-formed workpiece DW.

The second positional deviation calculation unit 116 receives signals from the sensor pairs SP13 and SP14, the sensor pairs SP21 to SP24, the sensor pairs SP31 to SP34, and the sensor pairs SP41 to SP44. The following is description on a function of the second positional deviation calculation unit 116 related to the single transfer module TM and the process module PM connected to the single transfer module TM which have been described with reference to FIGS. 3 to 5.

The second positional deviation calculation unit 116 calculates a deviation of the central position of the workpiece WP during actual transfer with respect to a reference position at which the center of the workpiece WP should be located during transfer to the process module PM by the transfer unit TR of the transfer module TM, i.e., the second positional deviation. In order to calculate the second positional deviation, the second positional deviation calculation unit 116 uses the signals from the light receivers SR of the sensors S11 and S12 of the sensor pair SP. The sensor pair SP is provided at a region along the transfer route of the workpiece WP to the process module PM by the transfer unit TR of the transfer module TM.

The second positional deviation calculation unit 116 calculates two timings at which the level of the signal of the light receiver SR of the sensor S11 changes during the transfer of the workpiece WP. The two timings include a start timing and a termination timing of a period in which the light L from the light emitter ST of the sensor S11 is blocked by the workpiece WP. The second positional deviation calculation unit 116 calculates two timings at which the level of the signal of the light receiver SR of the sensor S12 changes during the transfer of the workpiece WP. The two timings include a start timing and a termination timing of a period in which the light L from the light emitter ST of the sensor S12 is blocked by the workpiece WP.

The second positional deviation calculation unit 116 calculates the central position of the workpiece WP at a reference time during the actual transfer based on the two start timings and the two termination timings. For example, the second positional deviation calculation unit 116 can calculates coordinates of four points at the edge of the workpiece WP at the reference time from a time difference between one of the two start timings and the reference time, a time difference between the other start timing and the reference time, a time difference between one of the two termination timings and the reference time, a time difference between the other termination timing and the reference time, a distance between the sensors S11 and S12, and a transfer speed of the workpiece WP. The central position of the workpiece WP can be calculated from the coordinates of the four points. The reference time may be one of the two start timings or one of the two termination timings, or may be set between the earliest timing and the latest timing among the two start timings and the two termination timings.

The second positional deviation calculation unit 116 calculates the reference position where the center of the workpiece WP should be located at the reference time. The reference position can be obtained from a route of a predetermined point on the end effector EE of the transfer unit TR and the reference time. The transfer route of the predetermined point is known to the control unit MCU, and the control unit MCU applies a control signal to the driving unit DM of the transfer unit TR so that the corresponding transfer route can be realized. Therefore, the second positional deviation calculation unit 116 can obtain a position in the transfer route at the reference time, i.e., the reference position.

The second positional deviation calculation unit 116 calculates a deviation of the central position of the workpiece WP at the reference time during actual transfer with respect to the reference position, i.e., the second positional deviation. The second positional deviation calculated by the second positional deviation calculation unit 116 is used by the second correction unit 118. As described above, the second positional deviation of the workpiece WP on the end effector EE can also be obtained based on positional information (encoder value) of the transfer unit TR and positional information of the transfer unit TR upon ON/OFF of each sensor, in addition to the case where the second positional deviation is calculated based on the two start timings and the two termination timings.

The second correction unit 118 corrects the transfer position of the workpiece WP to each of the process modules corresponding to the transfer modules TM1 to TM4. Each of the process modules corresponding to the transfer modules TM1 to TM4 allows access of the transfer unit of the corresponding transfer module. The corrected transfer position is a predetermined transfer position registered for each process module in the second correction unit 118.

When the first positional deviation has not been obtained, e.g., when the workpiece WP is transferred to a process module of a transfer destination in order to obtain the first positional deviation, the second correction unit 118 corrects the predetermined transfer position of the transfer module transferring the workpiece WP among the transfer modules TM1 to TM4 by using the second positional deviation. The second correction unit 118 controls the driving unit of the transfer unit of the transfer module transferring the workpiece WP such that the workpiece WP is transferred to the corrected transfer position. Accordingly, the difference between the predetermined position in the process module of the transfer destination and the central position of the workpiece WP is reduced or eliminated.

When the first positional deviation for each of the process modules PM1 to PM8 has been obtained, the second correction unit 118 corrects the predetermined transfer position of the transfer module transferring the workpiece WP among the transfer modules TM1 to TM4 by using the first positional deviation obtained for the process module of the transfer destination. In one embodiment, the second correction unit 118 corrects the predetermined transfer position of the transfer module transferring the workpiece WP among the transfer modules TM1 to TM4 by using the second positional deviation obtained during the transfer of the workpiece WP as well as the first positional deviation obtained for the process module of the destination. The second correction unit 118 controls the driving unit of the transfer unit of the transfer module transferring the workpiece WP such that the workpiece WP is transferred to the corrected transfer position. Accordingly, the difference between the central position of the workpiece WP and the central position of the mask 26 of the process module that serves as the film forming apparatus among the process modules PM1 to PM8 is reduced or eliminated.

Figure 14:
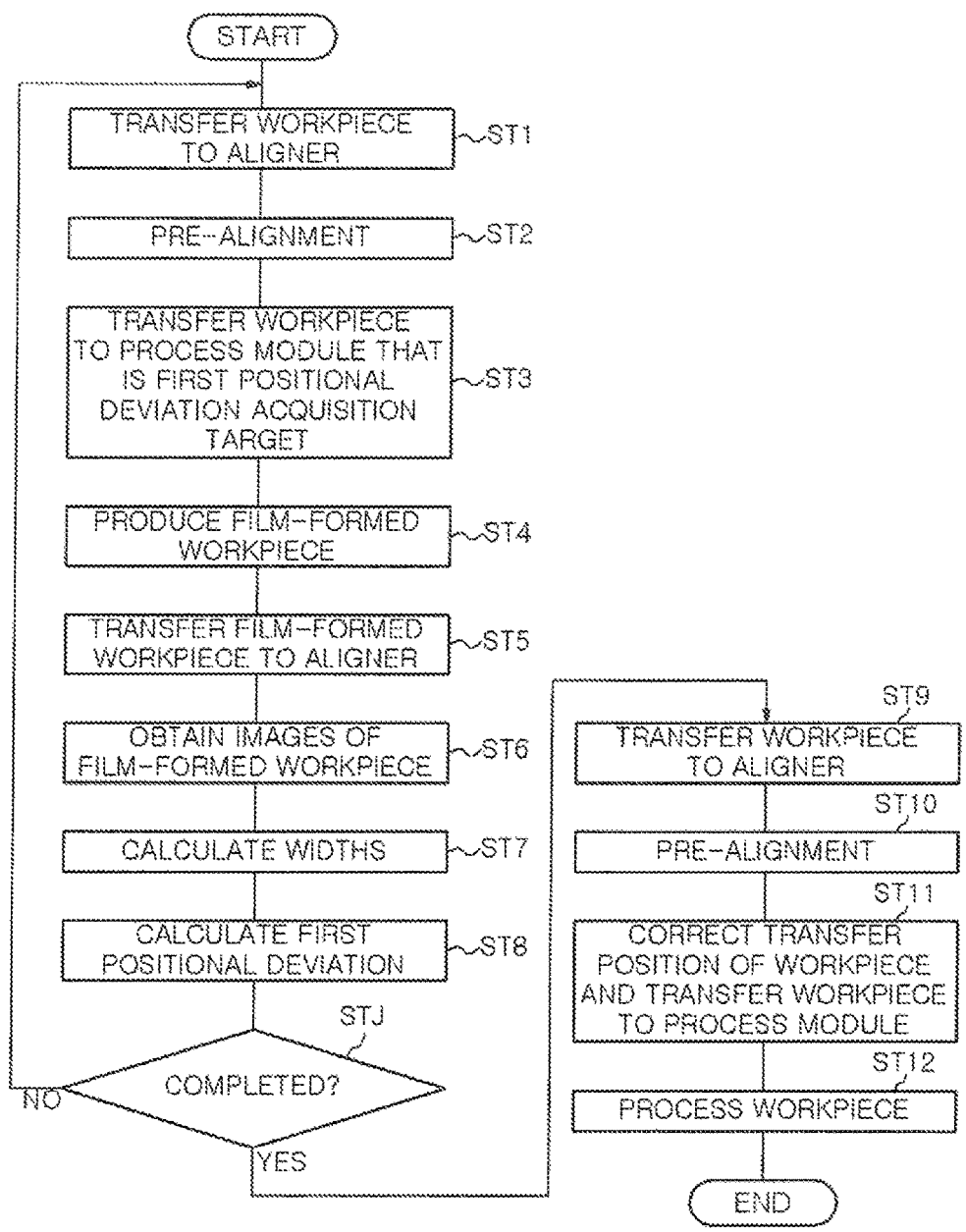
FIG. 14 is a flowchart showing an operation of the film forming system shown in FIG. 1.

Hereinafter, the operation of the film forming system 1 which includes the acquisition of the first positional deviation and the correction of the transfer position after the acquisition of the first positional deviation will be described with reference to FIG. 14. FIG. 14 is a flowchart showing the operation of the film forming system shown in FIG. 1.

First, in a step ST1, in order to obtain the first positional deviation, the workpiece WP is unloaded from the FOUP FP by the transfer unit LR of the loader module LM and then transferred to the aligner AU. The workpiece WP transferred in the step ST1 is used for obtaining the first positional deviation and may not be used for an actual product. Next, in a step ST2, the pre-alignment is performed by the aligner AU.

Then, in a step ST3, the workpiece WP is transferred to a process module that is a first positional deviation acquisition target among the process modules PM1 to PM8. During the transfer operation in the step ST3, the workpiece WP is transferred from the aligner AU to any one of the load-lock modules LL1 and LL2 and then to the process module that is the first positional deviation acquisition target by a transfer unit of a transfer module which is accessible to the process module that is the first positional deviation acquisition target. Thereafter, in a step ST4, in the process module that is the first positional deviation acquisition target, the workpiece WP is subjected to film formation and, thus, the film-formed workpiece DW is produced. Then, in a step ST5, the film-formed workpiece DW is transferred to the aligner AU.

Next, in a step ST6, in the aligner AU, a plurality of images is obtained by the camera 102 in a state where the workpiece DW is rotated by the rotational stage RST as described above. Then, in a step ST7, a plurality of widths is calculated based on the images obtained by the camera 102 by the width calculation unit 112 of the control unit MCU. Thereafter, in a step ST8, the first positional deviation calculation unit 114 of the control unit MCU calculates the first positional deviation based on the widths as described above.

In one embodiment (hereinafter, referred to as "first embodiment"), the first positional deviation is calculated by transferring the workpiece WP to process modules serving as film forming apparatuses among the process modules PM1 to PM8 from transfer modules that are accessible to the process modules serving as the film forming apparatuses among the transfer modules TM1 to TM4. In other words, the first positional deviation is obtained from all the combination of the process modules serving as the film forming apparatuses among the process modules PM1 to PM8 and the transfer modules that are accessible to the corresponding process modules. For example, in the example of FIG. 1, when the process modules other than the process module PM6 among the process modules PM1 to PM8 are film forming apparatuses, twelve combinations are obtained.

In another embodiment (hereinafter, referred to as "second embodiment"), with respect to the process module which is the film forming apparatus among the process modules PM1 to PM8 and to which two transfer modules are accessible, the workpiece WP is transferred from only one of the two transfer modules to obtain the first positional deviation. For example, in the example of FIG. 1, when the process modules other than the process module PM6 among the process modules PM1 to PM8 are film forming apparatuses, the first positional deviation is obtained by transferring the workpiece WP from only one of the transfer modules TM1 and TM2 to the process module PM1. Further, the first positional deviation is obtained by transferring the workpiece WP from only one of the transfer modules TM1 and TM2 to the process module PM2. Further, the first positional deviation is obtained by transferring the workpiece WP from only one of the transfer modules TM2 and TM3 to the process module PM3. Further, the first positional deviation is obtained by transferring the workpiece WP from only one of the transfer modules TM2 and TM3 to the process module PM4. Further, the first positional deviation is obtained by transferring the workpiece WP from only one of the transfer modules TM3 and TM4 to the process module PM5. Further, the first positional deviation is obtained by transferring the workpiece WP from the transfer module TM4 to the process module PM7. Further, the first positional deviation is obtained by transferring the workpiece WP from the transfer module TM4 to the process module PM8. In this example, there are seven combinations of the process modules and the transfer modules which are used for obtaining the first positional deviation.

In a STJ, it is determined whether or not the first positional deviation has been obtained from all the above-described combinations. When it is determined that the first positional deviation has not been obtained from all the combinations, the steps ST1 to ST8 are executed again for the combinations of the process module and the transfer module which have not been used for obtaining the first positional deviation. On the other hand, when it is determined in the step STJ that the first positional deviation has been obtained from all the combinations, the processing proceeds to a step ST9.

In the ST9, as in the step ST1, the workpiece WP is unloaded from the FOUP FP and transferred to the aligner AU by the transfer unit LR of the loader module LM. The step ST9 and subsequent steps are processes for the workpiece WP used for manufacturing an actual product. Next, in a step ST10, the aforementioned pre-alignment is performed by the aligner AU.

Then, in a step ST11, the workpiece WP is transferred to a process module selected by a process recipe among the process modules PM1 to PM8. In the transfer operation of the step ST11, the transfer position of the workpiece WP is corrected by using the first positional deviation and the second positional deviation by the second correction unit 118 of the control unit MCU. The transfer position of the workpiece WP to the process module other than the film forming apparatus is corrected only by using the second positional deviation. In the case of employing the first embodiment, in the step ST11, the transfer position is corrected by using the first positional deviation obtained from the combination of the process module of the transfer destination specified by the process recipe and the transfer module transferring the workpiece WP to the process module of the transfer destination. In the case of employing the second embodiment, the first positional deviation is obtained by transferring the workpiece to the process module serving as the film forming apparatus from only one of the two transfer modules that are accessible to the corresponding process module. In the step ST11, the first positional deviation obtained by transferring the workpiece from any one of the two transfer modules to the process module of the transfer destination is used for correcting the transfer position.

Next, in a step ST12, the workpiece WP is processed in the process module of the destination. In the process module serving as the film forming apparatus, the workpiece WP is subjected to film formation. In other process modules, the workpiece is subjected to a dedicated process of the corresponding process module, e.g., heat treatment.

The operation of the film forming system 1 is realized under the control of the control unit MCU. The control unit MCU may include one or more computer devices having a processor and a storage device such as a memory. In that case, the control unit MCU operates based on a program stored in the storage device and also operates based on a process recipe stored in the storage device to control the respective components of the film forming system 1. The control unit MCU may be one or more hardwares, e.g., a dedicated circuit, which can realize the operation of the film forming system 1.

In the above-described film forming system 1, a plurality of widths between the edge E1 of the film-formed workpiece DW and the edge E2 of the film DF of the film-formed workpiece DW is obtained at circumferentially different locations of the film-formed workpiece DW. In other words, the circumferential distribution of the widths between the edge E1 of the film-formed workpiece DW and the edge E2 of the film DF of the film-formed workpiece DW is obtained. The biased distribution reflects the difference between the central position of the film DF and the central position of the film-formed workpiece DW (the central position of the workpiece WP or the base SB). Therefore, the deviation of the central position of the film DF with respect to the central position of the film-formed workpiece DW, i.e., the first positional deviation, can be obtained based on the widths. In the film forming system 1, the transfer position of the transfer module is corrected by using the first positional deviation such that the central position of the workpiece WP coincides with the central position of the film DF. Accordingly, it is possible to reduce or eliminate the difference between the central position of the film DF formed on the workpiece WP and the central position of the workpiece WP.

When there are two transfer modules that are accessible to a single process module, the first positional deviation may be obtained by using the film-formed workpiece DW produced from the workpiece WP transferred from one of the transfer modules. The first positional deviation thus obtained is also used for correcting the transfer position of the other transfer module. Therefore, time required to obtain the first positional deviation can be reduced compared to when the first positional deviation is obtained by transferring the workpiece WP from each of the two transfer modules to the single process module.

The present disclosure is not limited to the above-described embodiment and may be variously modified. For example, the number of process modules and the number of transfer modules are not limited as long as the film forming system 1 includes one or more processing modules serving as film forming apparatuses and one or more transfer modules. The image pickup mechanism including the camera and the rotational stage may be provided separately from the aligner AU at an outside of the process modules PM1 to PM8.

While the disclosure has been shown and described with respect to the embodiments, it will be understood by those skilled in the art that various changes and modifications may be made without departing from the scope of the disclosure as defined in the following claims.

What is claimed is:

1. A film forming system comprising:
one or more film forming apparatuses configured to produce a film-formed workpiece by forming a film on a region inward of a circular edge of a workpiece in a state where a mask having a circular opening is disposed on the corresponding region;
one or more transfer modules configured to transfer the workpiece to said one or more film forming apparatuses;
an image pickup mechanism disposed at an outside of said one or more film forming apparatuses; the image pickup mechanism comprising a rotational stage configured to rotatably support the workpiece or the film-formed workpiece about a center thereof and a camera having a field of view in a region through which an edge of the film-formed workpiece rotated by the rotational stage and an edge of the film of the film-formed workpiece pass; and a control unit including a width calculation unit, a film positional deviation calculation unit and a correction unit, wherein the control unit is programmed to perform width calculation, film positional deviation calculation and correction,
wherein:
the width calculation unit is configured to obtain, based on three or more images obtained by the camera during the rotation of the film-formed workpiece by the rotational stage, a plurality of widths between the edge of the film-formed workpiece and the edge of the film of the film-formed workpiece at circumferentially different locations;
the width calculation unit is further configured to detect the edge of the film-formed workpiece and the edge of the film of the film-formed workpiece based on locations of peaks of a differential value of a luminance of a pixel array of each image;
the film positional deviation calculation unit is configured to obtain, based on the widths obtained by the width calculation unit, a first positional deviation that is a deviation of a central position of the film of the film-formed workpiece with respect to a central position of the film-formed workpiece; and
the correction unit is configured to correct, by using the first positional deviation of the film-formed workpiece produced by each of said one or more film forming apparatuses, a transfer position of any of said one or more transfer modules which transfers the workpiece to any of said one or more film forming apparatuses which has been used for producing the film-formed workpiece.

2. The film forming system of claim 1, wherein said one or more film forming apparatuses are a plurality of film forming apparatuses and said one or more transfer modules are a plurality of transfer modules,
wherein the plurality of film forming apparatuses includes a film forming apparatus to which two transfer modules are accessible among the plurality of transfer modules,
wherein the workpiece is transferred to the film forming apparatus to which two transfer modules are accessible from only one of the two transfer modules in order to obtain the first positional deviation from the film-formed workpiece produced by the film forming apparatus to which two transfer modules are accessible, and
wherein the correction unit is configured to correct, by using the first positional deviation obtained from the film-formed workpiece produced by the film forming apparatus to which two transfer modules are accessible using the workpiece transferred said one of the two transfer modules, the transfer position of the workpiece that is transferred by said one of the two transfer modules to the film forming apparatus to which two transfer modules are accessible.

3. The film forming system of claim 2, further comprising:
a workpiece positional deviation unit configured to obtain a second positional deviation that is a deviation of a central position of a workpiece being transferred to the film forming apparatus to which two transfer modules are accessible by the other of the two transfer modules with respect to a reference position at which the central position of the workpiece is located during the transfer,
wherein the correction unit is configured to correct, by using the second positional deviation obtained by the workpiece positional deviation unit and the first positional deviation obtained from the film-formed workpiece produced by the film forming apparatus to which two transfer modules are accessible using the workpiece transferred by said one of the two transfer modules, the transfer position of the workpiece that is transferred by the other of the two transfer modules to the film forming apparatus to which two transfer modules are accessible.

4. The film forming system of claim 1, further comprising:
a light emitter configured to emit light perpendicular to the edge of the workpiece and
a light receiver configured to receive the light,
wherein the light emitter and the light receiver are arranged in a vertical direction so that the workpiece passes therebetween, and
wherein the light receiver configured to output a signal having a level determined by an amount of the received light to the control unit.

5. The film forming system of claim 3, further comprising:
a light emitter configured to emit light perpendicular to the workpiece and
a light receiver configured to receive the light,
wherein the light emitter and the light receiver are provided along a transfer route of the workpiece to a film forming apparatus, and
wherein the light receiver configured to output signals having different levels depending on presence or absence of the workpiece between the light emitter and the light receiver to the control unit, the signals being used by the workpiece positional deviation unit.

* * * * *